United States Patent [19]
Otaka et al.

[11] Patent Number: 5,650,714
[45] Date of Patent: Jul. 22, 1997

[54] ORTHOGONAL SIGNAL GENERATION SYSTEM

[75] Inventors: Shoji Otaka, Yokohama; Hiroshi Tanimoto, Kawasaki, both of Japan

[73] Assignee: Kabushiki Kaisha Toshiba, Kawasaki, Japan

[21] Appl. No.: 303,815

[22] Filed: Sep. 9, 1994

[30] Foreign Application Priority Data

Sep. 9, 1993 [JP] Japan .................. 5-224365

[51] Int. Cl.$^6$ .................................................. G05F 3/00
[52] U.S. Cl. ........................................ 323/217; 323/218
[58] Field of Search ................................ 323/212, 213, 323/217, 218; 327/238, 254, 258

[56] References Cited

U.S. PATENT DOCUMENTS

| | | | |
|---|---|---|---|
| 3,568,045 | 3/1971 | Yorke | 323/217 |
| 3,694,567 | 9/1972 | Kresock | 323/217 |
| 4,725,767 | 2/1988 | Mori | 323/218 |
| 4,737,703 | 4/1988 | Hayakawa | 323/213 |
| 5,043,654 | 8/1991 | Philippe | 323/219 |

FOREIGN PATENT DOCUMENTS

| | | |
|---|---|---|
| 60-43910 | 8/1983 | Japan . |
| 63-121307 | 11/1986 | Japan . |
| 3109626 | 2/1990 | Japan . |

*Primary Examiner*—Matthew V. Nguyen
*Attorney, Agent, or Firm*—Oblon, Spivak, McClelland, Maier & Neustadt, P.C.

[57] ABSTRACT

A local signal of preset frequency is supplied to an input terminal of a signal input section. The local signal is supplied to a control input terminal of a variable current source, a current corresponding to the local signal is output from the variable current source, and the current is supplied to a phase shifting section. The phase shifting section includes an integrator constructed by a capacitor and a resistor connected in series and a differentiator constructed by a resistor and a capacitor connected in parallel. As parallely connecting the phase shifting circuit with a linear element of which the signal input section consists, the phase shifting section outputs first and second output signals which has the same frequency as the local signal and whose phases are different from each other by 90°. The output signals of the phase shifting section are output to the next stage via an orthogonal signal output section constructed by current source and transistors.

18 Claims, 8 Drawing Sheets

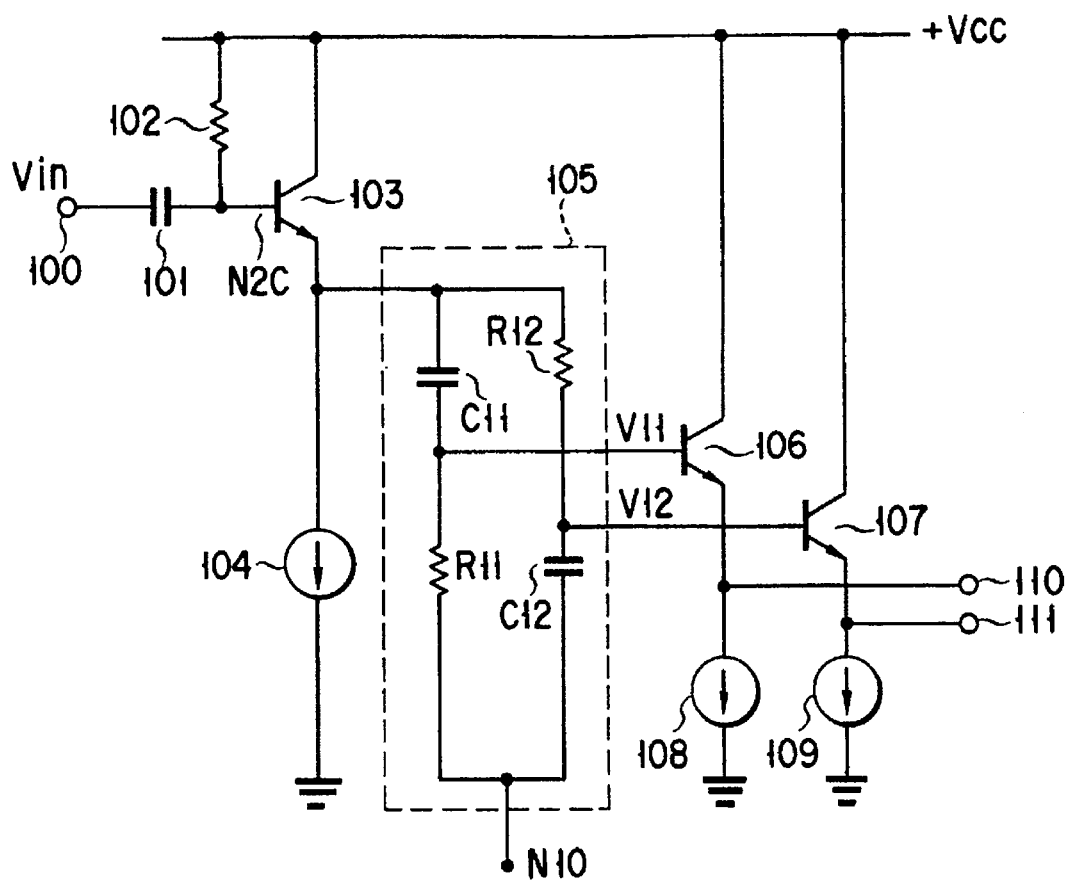
F I G. 1
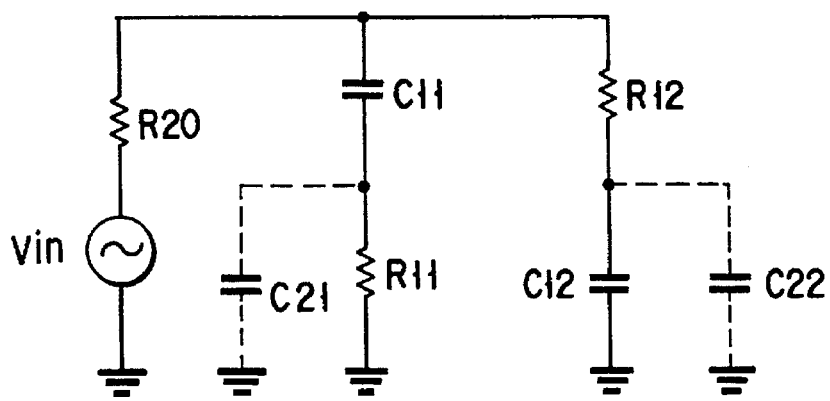
F I G. 2

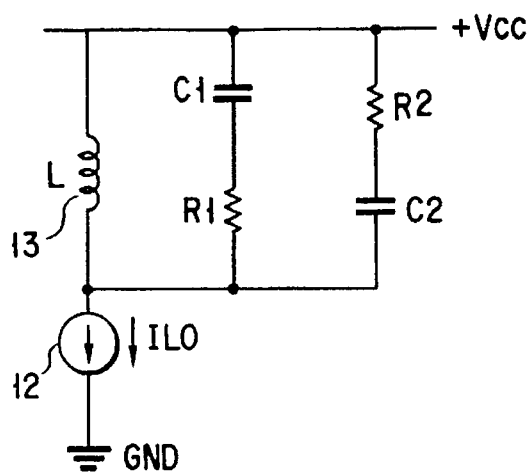
F I G. 5
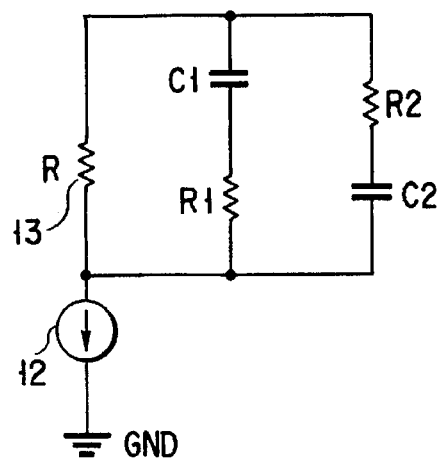
F I G. 6
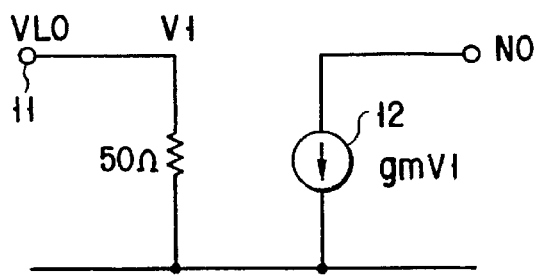
F I G. 7
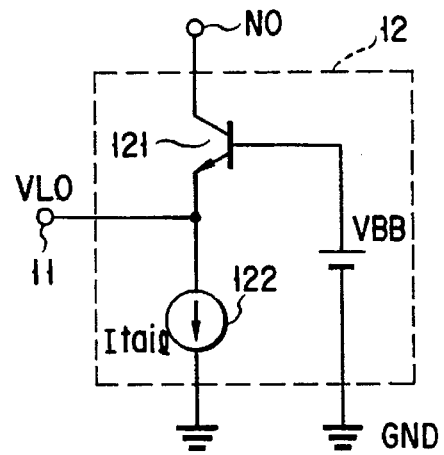
F I G. 8
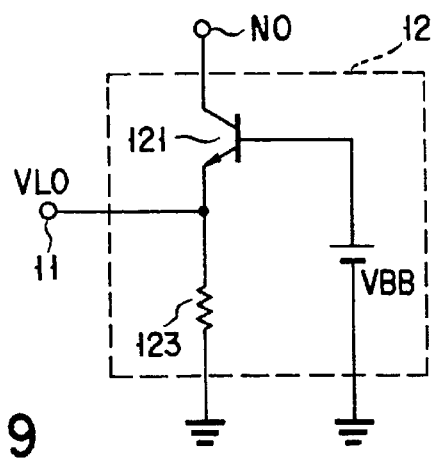
F I G. 9

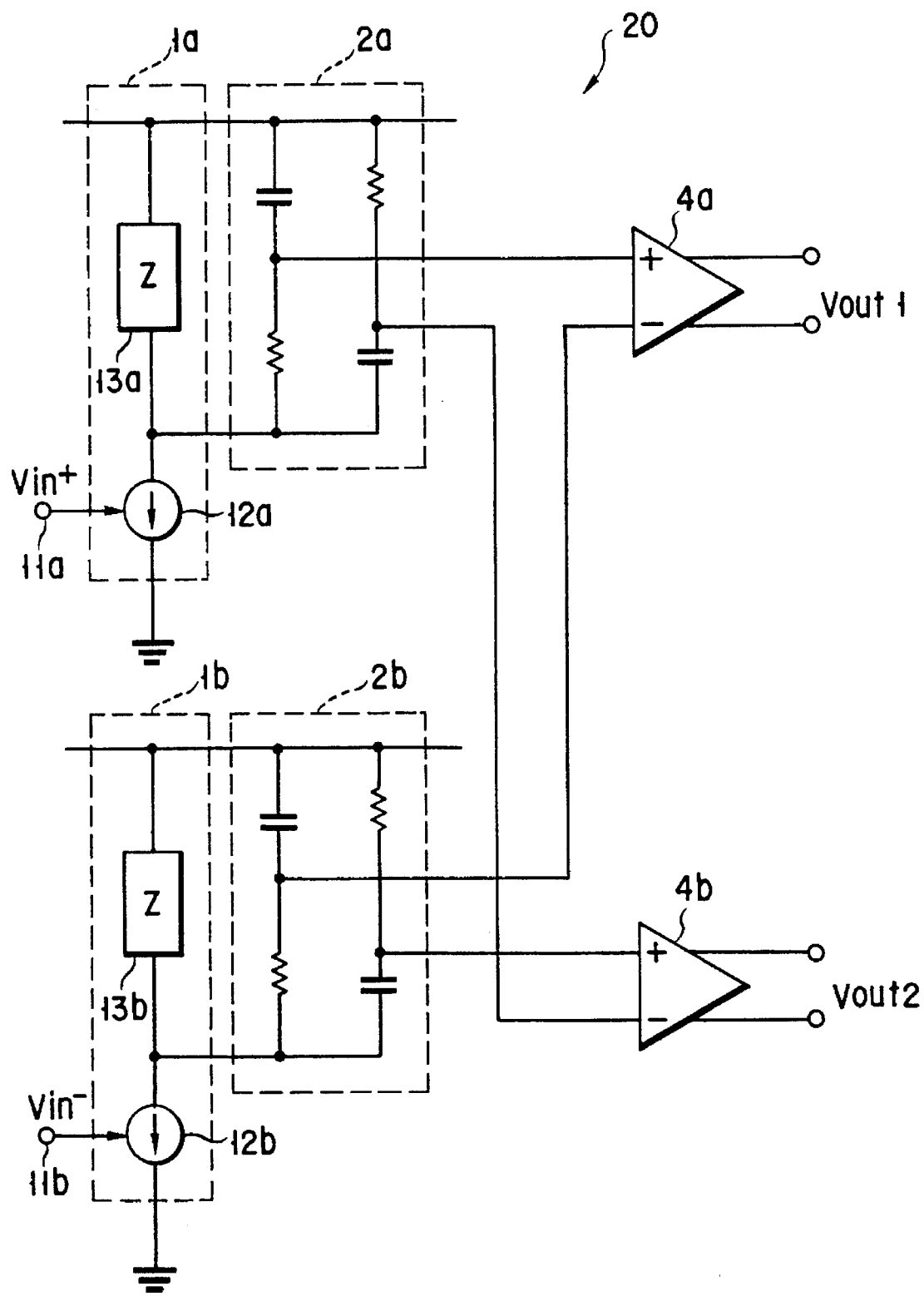
F I G. 10

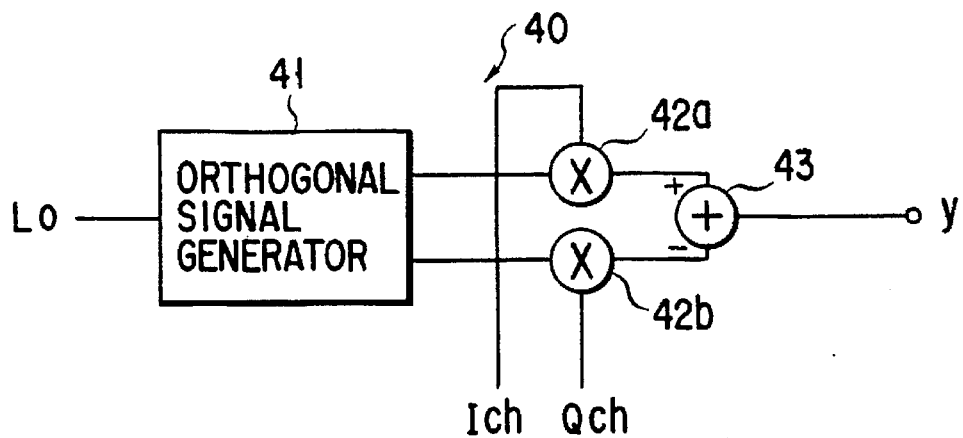
F I G. 11A
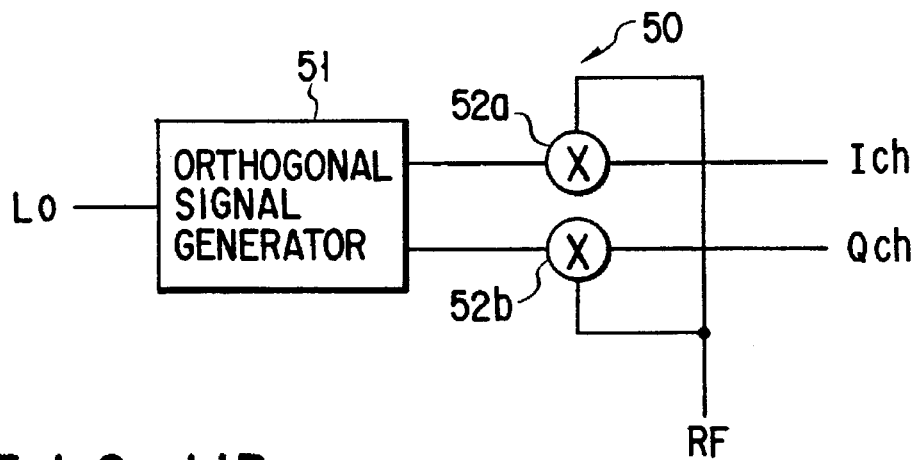
F I G. 11B
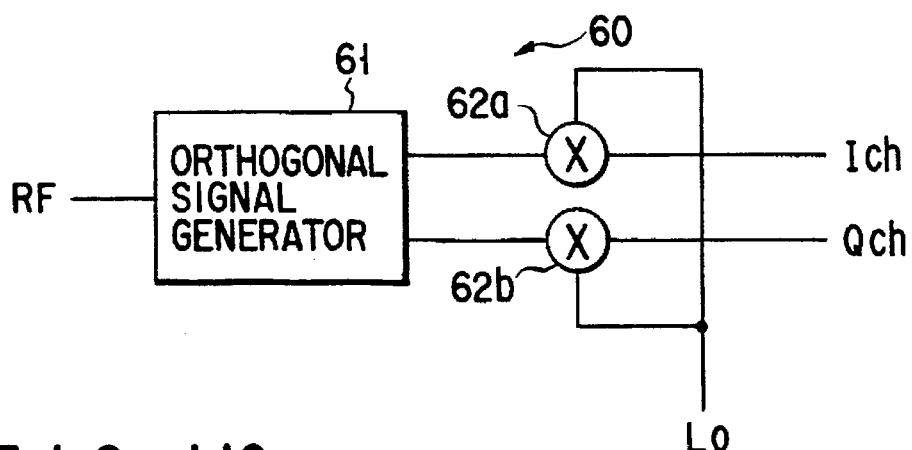
F I G. 11C

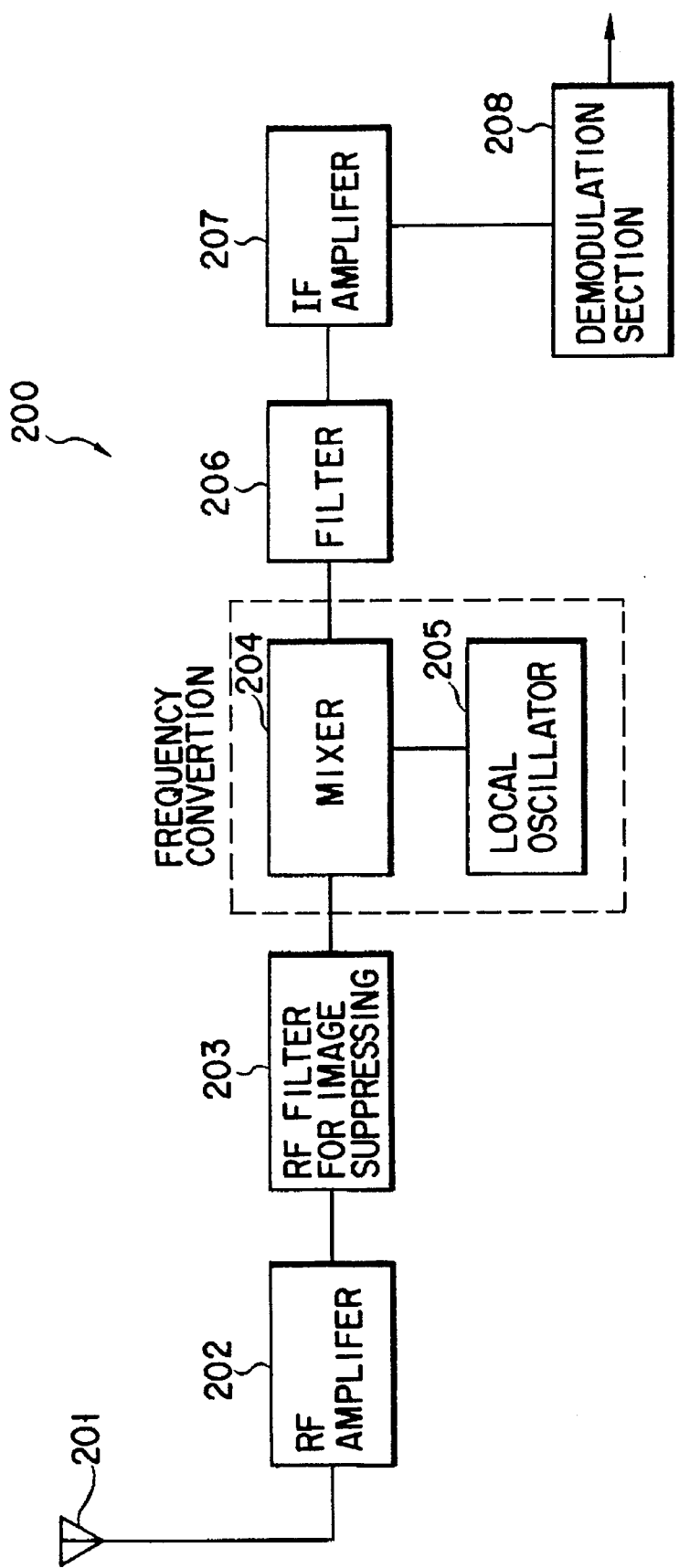
F I G. 12

ORTHOGONAL SIGNAL GENERATION SYSTEM

BACKGROUND OF THE INVENTION

1. Field of the Invention

This invention relates to a signal generation system applied to a mobile communication device such as a portable wireless telephone or the like, and more particularly to an orthogonal signal generation system for generating carrier signals or RF (radio frequency) signals whose phases are different from each other by 90° and which are used for orthogonal modulation/demodulation.

2. Description of the Related Art

In recent years, as represented by portable wireless telephones and cellular (radio) phones, mobile communication devices which can communicate in desired places are actively developed. For example, since this type of communication device is carried by a man or mounted in a car, it is desired to reduce the size and weight of the communication device. For this purpose, parts of the communication device are required to be formed in a monolithic IC form suitable for reduction in size and weight rather than in the form of conventional hybrid IC (integrated circuit). Further, since it is necessary to drive the portable wireless telephone by use of a battery, it is desired to develop an IC which is operated on a low voltage.

In the above-described mobile communication device, an orthogonal modulation/demodulation system for superposing a speech signal on two carriers whose phases are different from each other by 90° and transmitting the speech signal is generally used as a communication system. In order to realize the orthogonal modulation system, it is necessary to create carrier signals whose phases are different from each other by 90° from a local signal generated from a local oscillator at high s/n (signal to noise) ratio. In this invention, a system for generating two output signals such as the two carrier signals set in an orthogonal relation is called an orthogonal signal generation system.

In the circuit of the conventional orthogonal signal generation system, a resister for terminating to prevent reflection of the local signal is arranged at an input terminal inputting the local signal. Since the voltage amplitude of the output signal of the orthogonal signal generation circuit is determined by the power of the input signal, causing a problem that a sufficiently high voltage gain cannot be obtained when the resister for terminating is set to 50Ω or 70Ω for example. In principle, it is possible to increase the voltage gain by selectively setting the value of the terminal resistor, but in the GHz band, one of the values 50Ω and 75Ω can be generally selected because of the impedance of the transmission line.

In general, transistors are employed in the circuit of the orthogonal signal generation system. Assuming that two cascated emitter follower are employed in the circuit and input signals are transmitted via the transistors, potentials of the output signals from the circuit are set to a low value by a voltage drop between a base and an emitter. Further, Judging from the recent trend of the requirement for operating various types of devices on low voltage, it is anticipated that the power supply voltage for portable wireless telephones and the like will be less than or equal to approx. 2.5 [V], thereby the above voltage drop will become a serious problem. For example, when the output signals of the circuit are amplified by use of a differential amplifier, the voltage drop occurs at the common emitter terminal of a pair of emitter-coupled transistors constructing the differential amplifier. When the power supply voltage is 2.5 [V] and if $V_{BE}$ of the transistor is approx. 0.7 [V], the potential of the common emitter terminal is set to approx. 0.1 to 0.4 [V] and it becomes difficult to operate a current source connected to the common emitter terminal. That is, in general mobile communication devices, the circuit following the orthogonal signal generation system will be disable for operating by the voltage drop.

In order to solve the above problem, it is possible to insert a capacitor between the output terminals of the circuit and the differential amplifier to cut off the DC component and shift the DC level of the input of differential amplifier by use of a level shifting circuit. However, with this construction, since it is necessary to form the level shifting circuit including the DC cut-off capacitor on an IC, the chip area and the lost of the power of the local signals are increased and the cost is raised and it is not preferable.

As described before, in the conventional orthogonal signal generation system, since the voltage (potential) of the output terminal is significantly lowered in comparison with a power supply voltage supplied to the system, it is not suitable for low voltage operation. Further, in the conventional orthogonal signal generation system, since it is required to attach a terminal resistor to the input side of a local signal, a sufficiently high voltage gain cannot be obtained.

SUMMARY OF THE INVENTION

A first object of this invention is to provide an orthogonal signal generation system capable of creating two output signals whose phases are different from each other by 90° with high precision and providing a high voltage gain.

A second object of this invention is to provide an orthogonal signal generation system which can create two output signals whose phases are different from each other by 90° with high precision and which can be operated on low voltage.

According to a first aspect of this invention, there is provided an orthogonal signal generation system which comprises current control means including a variable current source, for controlling a current value according to an input signal; phase shifting means for outputting first and second signals whose phases are different from each other by 90°; and a power supply for supplying a preset voltage to the current control means and phase shifting means.

In the orthogonal signal generation system, the current control means includes a linear element connected between the power supply and the variable current source, and the phase shifting means includes an integrator and a differentiator which are connected in parallel with the linear element.

According to a second aspect of this invention, there is provided an orthogonal signal generation system which comprises first current control means including a first variable current source, for controlling a first current value according to an input signal; second current control means including a second variable current source, for controlling a second current value according to an inverted signal of the input signal; first phase shifting means for outputting a first signal and a second signal which is shifted from the first signal by a phase of 90°; second phase shifting means for outputting a third signal and a fourth signal which is shifted from the third signal by a phase of 90°; output means for outputting a first differential signal between the first and third signals and a second differential signal between the second and fourth signals; and a power supply for supplying a preset voltage to the first and second current control means and the first and second phase shifting means.

In the orthogonal signal generation system with the above construction, a current of an amplitude corresponding to an AC signal is created in the variable current source, and the current is supplied to the linear element and the integrator and differentiator of the phase shifting circuit. As a result, output signals whose phases are different from each other by 90° are output from the integrator and differentiator.

By adjusting a bias current of the variable current source, the input impedance can be set to a specified value without attaching a terminal resistor to the input side. As a result, the voltage gain can be increased.

Further, the potential of an input node of the phase-shifter, that is, the potential of the terminal connected to the variable current source via the linear element is set to the potential level subtracted a voltage drop of the linear element from the potential level of the power supply, and unlike the conventional case, it is not lowered by the base-emitter voltage of the transistor. Therefore, the operating voltage range is enlarged and the low-voltage operation can be effected. In particular, as the above voltage drop does not occur when the linear element consists of an inductance element, it is possible to operate the orthogonal signal generation system by further low-voltage of the power supply. Further, it is not necessary to attach a DC cut-off capacitor to the output side, thereby making it possible to attain the construction which is suitable for formation of the monolithic IC and to get high gain because there is no power loss by a parasitic of DC cut off capacitor.

Further, since the DC potentials of the outputs of the integrator and differentiator of the phase shifting circuit can be both set to the same potential level as the power supply potential, parasitic capacitors associated with transistors constructing buffers can be made equal to each other when the buffers such as emitter followers are provided on the output sides of the integrator and differentiator. As a result, the phase error and amplitude error of the output signal caused by a deviation in the parasitic capacitors can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing the construction of the orthogonal signal generation system according to a first embodiment of the present invention;

FIG. 2 is an equivalent circuit diagram of a phase shifting circuit shown in FIG. 1;

FIG. 5 shows a first example of an equivalent circuit of a phase shifting section shown in FIG. 4;

FIG. 6 shows a second example of the equivalent circuit of the phase shifting section shown in FIG. 4;

FIG. 7 is an equivalent circuit diagram of a variable current source shown in FIG. 4;

FIG. 8 is a circuit diagram showing a first concrete example of the variable current source shown in FIG. 4;

FIG. 9 is a circuit diagram showing a second concrete example of the variable current source shown in FIG. 4;

FIG. 10 is a block diagram showing the construction of an orthogonal signal generation system according to a third embodiment of this invention;

FIGS. 11A to 11C are showing a modulator and a demodulator to which the orthogonal signal generation system of this invention is applied;

FIG. 12 is a block diagram showing the construction of a receiving section of a communication device to which a super-heterodyne system is applied;

DETAILED DESCRIPTION OF THE PREFERRED EMBODIMENTS

Figure 3:
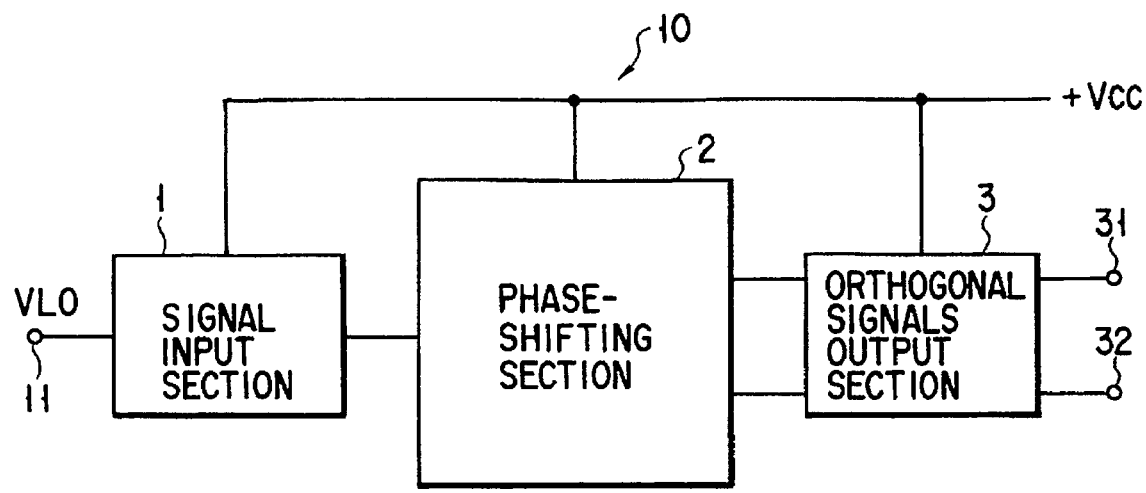
FIG. 3 is a block diagram showing the construction of an orthogonal signal generation system according to a second embodiment of this invention.

At first, a circuit shown in FIG. 1 according to the first embodiment of the present invention is provided in order to realize the orthogonal signal generation system. This circuit of the orthogonal signal generation system of the first embodiment is explained below with reference to FIGS. 1 and 2.

FIG. 1 shows the first provided circuit construction of the orthogonal signal generation system. A local signal input to an input terminal 100 is terminated at a terminal resistor 102 via a capacitor 101 and then input to a phase shifting circuit 105 via an emitter follower circuit which is constructed by a transistor 103 and a current source 104. The phase shifting circuit 105 includes a differentiator constructed by a capacitor C11 and a resistor R11 and an integrator constructed by a resistor R12 and a capacitor C12. A node N10 between the resistor R11 and the capacitor C12 is connected to a low impedance such as a power supply VCC or ground terminal, for example. The phase shifting circuit 105 outputs a signal whose phase is advanced with respect to the phase of a local signal from the differentiator and a signal whose phase is delayed with respect to the phase of a local signal from the integrator. An output signal of the differentiator is supplied to an output terminal 110 via an emitter follower circuit constructed by a transistor 106 and a current source 108, and an output signal of the integrator is supplied to an output terminal 111 via an emitter follower circuit constructed by a transistor 107 and a current source 109. Since the circuit is assumed to deal with a signal of GHz band, the circuit is constructed to have a terminal resistor 102 for impedance matching and permit only an AC component of the local signal to be supplied to the phase shifting circuit 105 by use of the capacitor 101.

In the orthogonal signal generation system, two output signals whose phases are different from each other by 90° and whose amplitudes are equal to each other are supplied to the output terminals 110, 111 by determining the element value as follows.

R11=R12, C11=C12

$$1/(\omega c * C11) = R11 \quad (1)$$

where ωc is a local signal frequency.

FIG. 2 shows an equivalent circuit of the phase shifting circuit shown in FIG. 1. R20 denotes an equivalent resistor of the transistor 103 as viewed from the emitter side thereof, and one end of the resistor is connected to a signal source Vin and the other end thereof is connected to the phase shifting circuit 105. C21, C22 denote parasitic capacitors such as a capacitor between the capacitor electrode and the ground. C11, C12 denote base-collector capacitors (Cμ) of the transistors 106, 107.

If the parasitic capacitors C21 and C22 are equal to each other, two output signals having no phase difference and no amplitude difference can be derived from the output terminals 110 and 111. However, if the parasitic capacitors C21 and C22 are made different from each other by a difference in the base-collector voltage of the transistors 106 and 107 or a variation in the manufacturing process, the phase relation and amplitude ratio between the two output signals derived from the output terminals 110 and 111 are changed. Therefore, in general, the sizes of the transistors 106, 107 are reduced so that the ratio of the capacitors C11, C12 to the parasitic capacitors C21, C22, i.e. the ratios of the capacitor C21 to the capacitor C11 and the capacitor C22 to the capacitor C12, can be reduced to suppress the influence by a fluctuation in the parasitic capacitors C21, C22.

In the circuit of the orthogonal signal generation system shown in FIG. 1, a sufficiently high voltage gain can not be attained. Because input voltage is smaller as input impedance is smaller when applied power is constant. That is, input voltage decreases if input impedance is small such as 50Ω or 75Ω. As will be described in detail later, the maximum gain of the output signal to the input signal of the conventional orthogonal signal generation system is $1/\sqrt{2}$. In principle, it is possible to increase the voltage gain by selectively setting the value of the terminal resistor 102, but in the GHz band, only one of the values 50Ω and 75Ω can be generally selected because of the impedance of the transmission line.

Further, the circuit constructing the orthogonal signal generation system has an advantage that the high precision can be maintained in a range up to the GHz band, but it has a disadvantage that it is not suitable for low-voltage operation by the following reason.

In FIG. 1, the potentials of the output terminals 110, 111 are set at maximum to a value which is lower than the power supply voltage +VCC by $2V_{BE}$ ($V_{BE}$ is a base-emitter voltage of the transistor). For example, the potential obtained at the output terminal 110 is set to a potential (+VCC$-V_{BE}$) which is lower than +VCC by $V_{BE}$ of the transistor 106, and the potential obtained at the output terminal 111 is set to a potential (+VCC$-2V_{BE}$) which is lower than +VCC by $V_{BE}$ of the transistors 103, 107.

Assuming that the output signals from the output terminals 110, 111 are generally amplified by use of a differential amplifier, the potential of the common emitter terminal of a pair of emitter-coupled transistors constructing the differential amplifier is further lowered by $V_{BE}$ of the transistor, and as a result, a voltage drop of $3V_{BE}$ with respect to the power supply voltage +VCC will occur.

Next, there will now be described second and third embodiments of this invention with reference to the accompanying drawings.

FIG. 3 shows the schematic construction of an orthogonal signal generation system according to a second embodiment of this invention. The orthogonal signal generation system 10 includes a signal input section 1, phase shifting section 2, and orthogonal signal generation output section 3. Each section is supplied with a power supply voltage +VCC.

The signal input section 1 generates a current corresponding to the signal generated from a local oscillator, and supplies the current to the phase shifting section 2. The phase shifting section 2 has an integrator and a differentiator and supplies signals (orthogonal signals) whose phases are different from each other by 90° to the orthogonal signal output section 3 according to the current supplied from the signal input section 1. The orthogonal signal output section 3 has a buffer circuit and transmits the orthogonal signals supplied from the phase shifting section 2 to the next stage via output terminals 31, 32.

Figure 4:
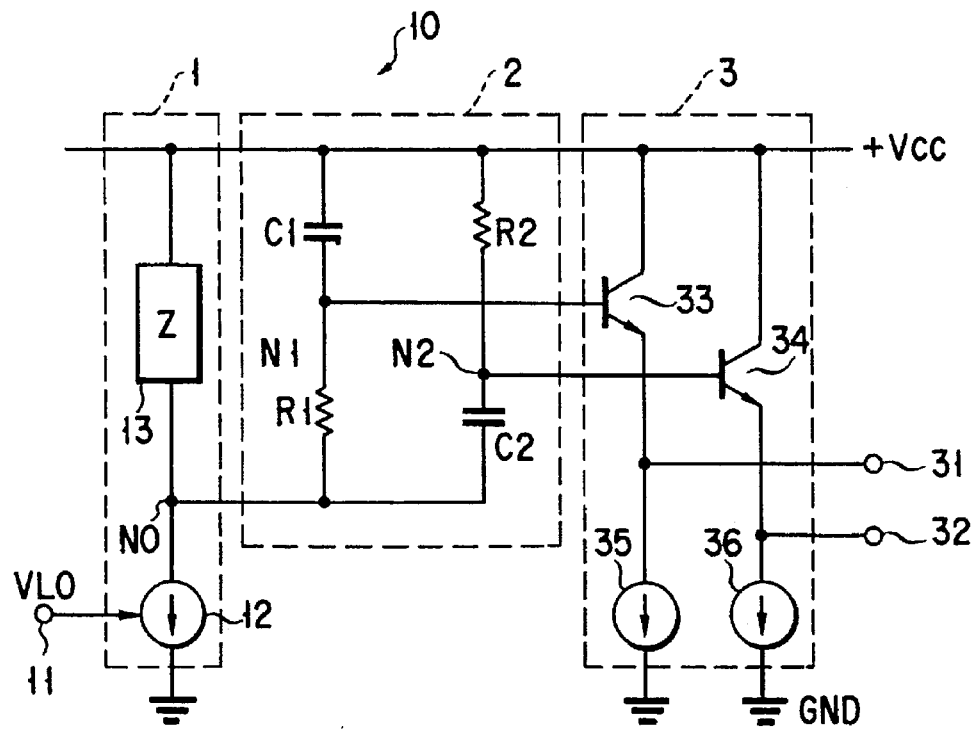
FIG. 4 is a diagram showing the circuit construction of the orthogonal signal generation system shown in FIG. 3.

An example of the concrete circuit construction of the above orthogonal signal generation system is shown in FIG. 4. An AC input signal, for example, local signal VLO generated from a local oscillator (not shown) is supplied to the input terminal 11 of the signal input section 1 shown by chain lines in FIG. 4. The local signal VLO is supplied to a control input terminal of a variable current source 12. As a result, a current whose value varies according to the local signal VLO is output from the variable current source 12. One end of the variable current source 12 is connected to the ground and the other end (node N0) thereof is connected to a positive power supply +VCC via a linear element 13. The linear element 13 is constructed by a passive element such as an inductor or resistor, for example. A circuit of the phase shifting section 2 is connected in parallel with the linear element 13.

The phase shifting section 2 includes an integrator which is constructed by a series circuit of a first capacitor C1 and a first resistor R1 and a differentiator which is constructed by a series circuit of a second resistor R2 and a second capacitor C2. With the above circuit construction, first and second output signals whose phases are different from each other by 90°.

The output node N1 (which is a connection node between the capacitor C1 and the resistor R1) of the integrator of the phase shifting section 2 and the output node N2 (which is a connection node between the resistor R2 and the capacitor C2) of the differentiator are respectively connected to the bases of transistors 33 and 34 in the orthogonal signal output section 3. The orthogonal signal output section 3 has current sources 35, 36 in addition to the transistors 33, 34. The transistors 33, 34 constitute emitter follower circuits in cooperation with the respective current sources 35, 36 and are used as buffer circuits for transmitting the output signals of the phase shifting section 2 to the next stage via the output terminals 31, 32. That is, the collectors of the transistors 33, 34 are connected to the power supply +VCC and the emitters thereof are respectively connected to one-side ends of the current sources 35, 36 and to the output terminals 31, 32. The other ends of the current sources 35, 36 are connected to the ground GND.

Next, the operation of the orthogonal signal generation system constructed as shown in FIG. 4 is explained with reference to the equivalent circuit of FIG. 5. Assume that the linear element 13 is an inductor of inductance L and C1=C2 and R1=R2 as shown in FIG. 5. An AC component ILO (which is hereinafter referred to as a local signal current) which is contained in the current output from the variable current source 12 and which corresponds to the local signal VLO is distributed to the linear element 13, integrator (C1, R1) and differentiator (C2, R2). In this case, if the current flowing in the integrator is Iint and the current flowing in the differentiator is Idif, then the currents Iint and Idif can be expressed by the following equation.

$$Iint = Idif \quad (2)$$
$$= 1/(R/j\omega L - 1/\omega^2 CL + 2) \cdot ILO$$

where $C=C1=C2$, $R=R1=R2$, and $\omega c$ is a local signal frequency.

It is understood from the equation (2) that the local signal current ILO can be input to the phase shifting section 2 with the current gain of substantially 1 by increasing the inductance L. Further, if the resonance frequency of L and C is set equal to the local signal frequency fc, |Iint|, |Idif| are set less than 0.67 and the ratio (current gain) of the local signal current ILO to the input current (currents flowing in the integrator and differentiator) of the phase shifting section 4 can be set equal to or larger than 0.5. As a gain of the orthogonal signal generation system is related to values of the resistors and capacitors that constitute the phase shifting section 2, the total gain is explained below.

As described before, orthogonal signals or first and second output signals whose phases are different from each other by 90° can be derived from the integrator and differentiator by inputting the local signal ILO to the integrator and differentiator of the phase shifting section 2. The first and second output signals are respectively supplied to the output terminals 31, 32 via the emitter follower circuits which are respectively constructed by the transistor 33 and current source 35 and the transistor 34 and current source 36. A differential amplifier is generally connected to the succeeding stage of the orthogonal signal output section 3, that is, output terminals 31, 32. The differential amplifier and the phase shifting section 2 are electrically isolated from each other by the emitter follower circuit.

In the orthogonal signal generation system of the first embodiment, when the linear element consists of inductance element, since the potential of the input node N0 of the phase shifting section 2 is set to the same potential level as the power supply +VCC, the operation voltage range can be enlarged by the base-emitter voltage $V_{BE}$ of the transistor in comparison with the conventional circuit construction shown in FIG. 1. That is, in the conventional circuit shown in FIG. 1, the potentials of the output terminals 110, 111 are set to the potential level which is lower than +VCC by $2V_{BE}$, but in the circuit of this embodiment shown in FIG. 4, the potentials of the output terminals 31, 32 are set to the potential level which is lower than VCC only by $V_{BE}$.

Therefore, assuming that the output signals from the output terminals 31, 32 are input to the differential amplifier, the potential of the common emitter terminal of the paired emitter coupled transistors in the differential amplifier is lowered than +VCC only by $2V_{BE}$. As a result, the potential of the common emitter terminal becomes equal to or higher than 1 [V] and the current source connected to the common emitter terminal can be operated without causing any problem even when +VCC is lowered to approx. 2.5 [V] in a portable wireless telephone, for example.

Further, in this embodiment, since the potentials of the output nodes N1, N2 of the integrator and differentiator of the phase shifting section 2 are set equal to +VCC, the base-collector capacitances (Cμ) of the transistors 33, 34 becomes equal to each other at the DC operating point. On the other hand, in the conventional case shown in FIG. 1, since it is difficult to set the base potentials of the transistors 106, 107 equal to each other, it is difficult to set the capacitances Cμ of the transistors equal to each other. A deviation in the capacitance Cμ (parasitic capacitance) caused by the DC bias causes a phase error and amplitude error in the orthogonal signals created by the orthogonal signal generation system. Therefore, the circuit of this embodiment is improved over the conventional circuit in the phase and amplitude precision.

In the first embodiment, the inductor is used as the linear element 13 as shown in FIG. 5, but a resistor R may be used as shown in FIG. 6. In this case, the potential of the input node N0 of the phase shifting section 2 is slightly lowered from +VCC by a current flowing in the resistor R and the operation voltage range is narrowed in comparison with a case where the inductor is used as the linear element 13. However, it is easy to design that a voltage drop across the resistor R can be made smaller than the base-emitter voltage $V_{BE}$, for example, it can be set to approx. 0.3 [V]. Therefore, the operation voltage range can be enlarged by at least approx. 0.4 [V] in comparison with the circuit used in the conventional case. Further, the base-collector capacitances of the transistors 33, 34 are made different from each by the voltage drop across the resistor R, but the difference between them is smaller than that in the circuit of the conventional case.

Next, the construction and operation of the variable current source 12 are explained with reference to the accompanying drawings. When the frequency of the local signal VLO which is an AC input signal of the orthogonal signal generation circuit is a frequency of GHz band, it is necessary to attain the impedance matching with the transmission line for transmitting the local signal from the local oscillator in the signal input section 1 of the orthogonal signal generation system 10 in order to input the local signal from the local oscillator. The characteristic impedance of the transmission line is generally 50Ω, and in this case, the input impedance of the orthogonal signal generation system 10 is set to 50Ω.

FIG. 7 shows an equivalent circuit of the variable current source 12 shown in FIG. 4 in the signal input section 1 of the orthogonal signal generation system 10. The input impedance of the input terminal 11 is 50Ω. Assume that the local signal current ILO flowing in the variable current source 12 has the relation expressed by the following equation with respect to the potential of the input terminal 11, that is, the voltage of the local signal VLO.

$$ILO = gm*VLO \quad (3)$$

where gm is a transconductance.

By use of the above variable current source 12, the local signal VLO can be converted into a local signal current ILO with high linearity.

FIG. 8 shows a first concrete example of the variable current source 12 realizing the equivalent circuit shown in FIG. 7. The input terminal 11 is connected to the emitter of a transistor 121 and to one end of a current source 122. The other end of the current source 122 is grounded. The base of the transistor 121 is grounded via a voltage source VBB. The collector of the transistor 121 is a current output terminal of the variable current source 12 and corresponds to the node N0 shown in FIG. 4. The input impedance Rin of the variable current source 12 can be approximately expressed by the following equation by setting the current of the current source 122 to Itail.

$$Rin = 1/gm \quad (4)$$

where gm=Itail/Vt, Vt (thermal voltage)=kT/q, k is the Boltzmann's constant, and q is the charge of an electron.

The input impedance Rin can be set to 50Ω by adjusting the bias current of the transistor 121, that is, the current Itail of the current source 122. Therefore, the current gain of the variable current source 12 is set to 1 according to the equations (3) and (4) and the output current ILO becomes equal to the AC component of the current based on the local signal VLO input to the input terminal 1.

FIG. 9 shows a second concrete example of the variable current source 12 realizing the equivalent circuit shown in FIG. 7. As shown in FIG. 9, the circuit construction of the second concrete example is obtained by replacing the current source 122 shown in FIG. 8 by a resistor 123. Since the potential of the input terminal 11 is given by (VBB−0.7 [V]) when the transistor 121 is operated, a desired current Itail can be obtained by setting the resistance R123 of the resistor 123 to a value expressed by the following equation.

$$Itail=(VBB-0.7)/R123 \tag{5}$$

In this case, since the input impedance Rin is a parallel resultant resistance of the impedance 1/gm as viewed from the emitter side of the transistor 121 and the resistance R123, Rin=50Ω can be realized with a current smaller than Itail given in FIG. 8. At this time, the current gain of the variable current source 12 is lowered by a conductance of 1/R123, but it is easy to obtain a current gain equal to or larger than 0.8.

Next, the voltage ratio of the local signal VLO input to the input terminal 11 to the output signal of the orthogonal signal generation system 10, that is, the voltage gain is explained in comparison with that of the circuit in the conventional case shown in FIG. 1. In this case, assume that the output impedance of the signal source connected to the input terminal 11 is 50Ω and transistors and passive elements used in the signal source and the orthogonal signal generation system are all ideal parts.

In the conventional circuit shown in FIG. 1, if the voltage of the signal source is Vin and the resistance of the terminal resistor 102 is 50Ω, then the potential VN20 of the node N20 is expressed by the following equation.

$$VN20=Vin/2 \tag{6}$$

Since the voltage gain of the emitter follower constructed by the transistor 103 and the current source 104 is ideally set to 1, an input voltage of the phase shifting circuit 105 is equal to the voltage of the node N20. Under the condition of the equation (1), the output signals V11, V12 of the phase shifting circuit 105 are expressed by the following equation irrespective of the values of the capacitors and the resistors.

$$V11=V12=1/(2\cdot\sqrt{2}))Vin \tag{7}$$

Therefore, the gain of the conventional circuit is set to $1/(2\times\sqrt{2})$ at maximum in a system which is designed by taking the impedance matching into consideration.

On the other hand, in the orthogonal signal generation system of this invention, the current gain is set to 1 as described before, and the following equation can be attained.

$$IL0=Vin/100 \tag{8}$$

Therefore, the output voltage V2 of the integrator is expressed by the following equation.

$$|V2|=|1/(j\omega cL-1/\omega c^2 CL+2)|\cdot R2\cdot Vin/100 \tag{9}$$

A value of approx. 0.67 can be obtained as the term of the absolute value in the equation (9) by adequately setting the local signal frequency to the resonance frequency of C and L, and the following expression can be obtained.

$$|V2|\leq 0.0067*R2*Vin \tag{10}$$

In order to make the voltage gain of the orthogonal signal generation system higher than the voltage gain of the conventional case, the condition expressed by the following expression may be satisfied.

$$0.067*R>1/(2\cdot\sqrt{2}) \tag{11}$$

Based on the above expression, the following expression can be obtained.

$$R>52\Omega \tag{12}$$

Therefore, by setting the resistance R2 equal to or larger than 52Ω, the voltage gain can be made higher than that of the circuit of the conventional orthogonal signal generation system shown in FIG. 1.

If actual numeric values are used, for example, if the local signal frequency fc is set to 2 GHz, the element values of the respective circuit sections are set such that C=C1=C2=0.6 pF, R=R1=R2=140Ω, and L=10 nH, then the current gain can be set to 0.93 according to the equation (9) and is approximately twice as high as that of the conventional case. In order to obtain the gain equivalent to that of the conventional case, the numeric values may be set under the condition of the equation (12) such that C=C1=C2=1.5 pF, R=R1=R2=52Ω, and L=4.2 nH. Therefore, if it is necessary to increase the capacitances of the capacitors C1, C2 in order to reduce the phase error due to the parasitic capacitor, the gain can be made higher than that of the conventional case when the capacitances are set equal to or less than 1.5 pF.

In the first embodiment, the inductor is used as the linear element 13, but it is clearly understood that the gain can be made higher than that of the conventional case even when a resistor is used as described before. However, since the resonance by L and C cannot be used, the gain is reduced in comparison with a case wherein the inductor is used.

Further, in the embodiments described in this detailed description, the bipolar transistors are used, but GaAs FETs or MOSFETs can be used.

The orthogonal signal generation system can be formed of the differential type based on the first embodiment shown in FIG. 4. The orthogonal signal generation system of the differential type is shown in FIG. 10. As shown in FIG. 10, in the third embodiment, two signal input sections and two phase shifting sections which respectively correspond to the signal input section 1 and the phase shifting section 2 of the second embodiment are used and two differential amplifiers are used instead of the orthogonal signal output section 3. That is, the orthogonal signal generation system 20 includes the signal input sections 1a, 1b, phase shifting sections 2a, 2b, and differential amplifiers 4a, 4b. Further, the orthogonal signal generation system 20 may includes buffer circuits such as the orthogonal signals output section 3 shown in FIG. 3 at the following of the phase shifting sections 2a, 2b respectively.

In the signal input sections 1a, 1b, AC input signals are supplied to input terminals 11a, 11b in a differential signal form. That is, the AC input signal supplied to the input terminal 11a and the AC input signal supplied to the input terminal 11b have phases different from each other by 180°. The AC input signals supplied to the input terminals 11a, 11b are supplied to the control input terminals of variable current sources 12a, 12b.

The signal input section 1a and the phase shifting section 2a constitute a first orthogonal signal generating section, and the signal input section 1b and the phase shifting section 2b constitute a second orthogonal signal generating section. A difference voltage between output signals from the integrators of the phase shifting sections 2a, 2b is amplified by the first differential amplifier 4a. A difference voltage between output signals from the differentiators of the phase shifting sections 2a, 2b is amplified by the second differential amplifier 4b. As a result, first and second output signals whose phases are different from each other by 90° can be derived from the differential amplifiers 4a, 4b. Further, according to the second embodiment, the design of the differential amplifiers 4a, 4b can be simplified and the high-frequency characteristic can be improved.

As described above in detail, in the orthogonal signal generation system of this invention, the phase precision and the amplitude precision of the output orthogonal signals whose phases are different from each other by 90° are high and a higher voltage gain can be attained. According to the orthogonal signal generation system, the low-voltage operation can be attained, and since the DC cut-off capacitor is not necessary, it can be suitably formed in the form of monolithic IC. Thus, it is suitable for a small-sized mobile communication device whose power supply voltage is low.

A modulator 40 and demodulators 50 and 60, each being a direct conversion type one, to which this invention is applied, will be described below with reference to FIGS. 11A, 11B and 11C.

As shown in FIG. 11A, the modulator 40 comprises a orthogonal signal generator 41 to which the orthogonal signal generation system of the invention is applied. A local signal Lo is input to the orthogonal signal generator 41, which generates two signals from the local signal Lo. These signals have phase difference 90° between them. The first signal is supplied to a multiplier 42a, and the second signal to a multiplier 42b. Two signals Ich and Qch, which are of different bands, are supplied to the multiplier 42a and 42b, respectively. The multiplier 42a multiplies the first signal by the signal Ich. The multiplies 42b multiples the second signal by the signal Qch. The signals output from the multipliers 42a and 42b are input to an adder 43. The adder 43 adds these signals together, generating a signal y(t). The signal y(t) is given as follows:

$$y(t)=Ich(t)\cdot\cos(\omega ct)-Qch(t)\cdot\sin(\omega ct) \qquad (13)$$

where $\cos(\omega ct)$ and $Ich(t)$ are the signals supplied to the multiplier 42a, and $\sin(\omega ct)$ and $Qch(t)$ are the signals supplied to the multiplier 42b.

Since the orthogonal signal generation system can acquire high gain as describe above, the proposed orthogonal signal generation system needs lower input power compared with conventional orthogonal signal generation system. Therefore, using the proposed circuit, local power is reduced. Moreover, because carrier feed-through from input terminal to output terminal depends on the input local power, carrier feed-through is reduced using the proposed circuit.

FIG. 11B shows the demodulator 50 which comprises a orthogonal signal generator 51 to which the orthogonal signal generation system of the invention is applied. A local signal Lo is input to the orthogonal signal generator 51, which generates two signals from the local signal Lo. These signals have phase difference of 90° between them. The first signal is supplied to a multiplier 52a, and the second signal to a multiplier 52b. An RF signal is also supplied to the multipliers 52a and 52b. The multiplier 52a multiplies the first signal by the RF signal and generates a signal Ich. The multiplier 42b multiples the second signal by the RF signal and generates a signal Qch.

Since the orthogonal signal generation system can acquire a large gain as described above, it can generate a signal of the same magnitude (level) as the output signal of the conventional orthogonal signal generation system, even if the local signal Lo has a small magnitude. Hence, input power applied to the demodulator 50 is small using the proposed circuit.

FIG. 11C shows the demodulator 60 which comprises a orthogonal signal generator 61 to which the orthogonal signal generation system of the invention is applied. An RF signal is input to the phase-shifting circuit 61, which generates two signals from the RF signal. These signals have phase difference of 90° between them. The first signal is supplied to a multiplier 62a, and the second signal to a multiplier 62b. A local signal Lo is also supplied to the multipliers 62a and 62b. The multiplier 62a multiplies the first signal by the local signal Lo and generates a signal Ich. The multiplier 62b multiplies the second signal by the local signal Lo and generates a signal Qch.

Since the orthogonal signal generation system can acquire a large gain as described above, the RF signal input to the orthogonal signal generator 61 has a great gain.

Next, an example of the mobile communication device to which this invention is applied is explained. FIG. 12 shows the schematic construction of a receiver to which a super-heterodyne system is applied. The receiver 200 includes an antenna 201, high-frequency amplifier 202, image compressing RF filter 203, mixer 204, local oscillator 205, filter 206, IF amplifier 207, and demodulator 208.

An RF signal received by the antenna 201 is amplified by the RF amplifier 202 and then supplied to the image compressing RF filter 203. The RF signal is subjected to the filtering process in the image compressing RF filter 203 so that the image frequency component thereof will be eliminated. After this, the RF signal is mixed with a carrier created by the local oscillator 205 in the mixer 204 and the frequency thereof is converted into an intermediate frequency. In general, in the super-heterodyne system, such frequency conversion processes are effected one to three times. As a result, the thus created intermediate frequency (IF) signal is selected for a desired channel by the filter 206 for final channel selection. Further, the intermediate frequency signal is amplified by the intermediate frequency amplifier (which is normally an AGC amplifier) 207 and then subjected to the demodulation process by the demodulating section 208.

Next, the demodulating section (orthogonal demodulating section) 208 to which the orthogonal signal generation system of this invention is applied is explained. In the orthogonal demodulating section 208, the intermediate frequency (IF) signal supplied from the intermediate frequency amplifier 207 is mixed with a local oscillator signal having the same frequency as the former signal, converted into a base band and then detected.

Figure 13:
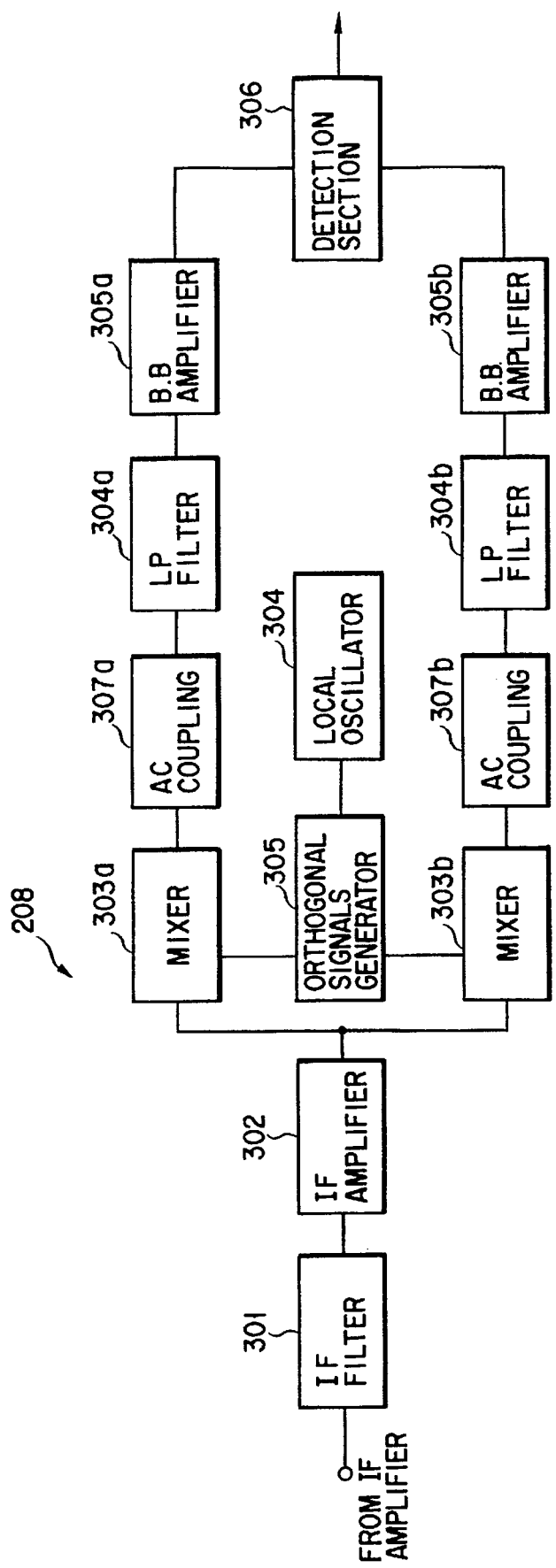
FIG. 13 is a block diagram showing the construction of a demodulator shown in FIG. 11 to which the orthogonal signal generation system of this invention is applied.

Now, the operation of the orthogonal demodulating section 208 is explained with reference to FIG. 13. FIG. 13 shows an example of the construction of the orthogonal demodulating section 208. The IF signal supplied from the intermediate frequency amplifier 207 passes an IF filter 301 and is then amplified by an IF amplifier 302. Further, the IF signal is divided into two channels after amplification. The respective signals divided into the two channels are mixed with carriers in the mixers 303a, 303b. The carriers supplied to the mixers 303a, 303b are signals whose phases are different from each other by 90° and which are created by use of the orthogonal signal generation circuit 305 to which the orthogonal signal generation system shown in FIG. 4 is applied, for example, based on a signal generated from the local oscillator 304. Therefore, the phases of the signals output from the mixers 303a, 303b are different from each other by 90°. By the above process, the IF signal supplied to the orthogonal demodulating section 208 is converted into base band signals.

The thus converted base band signals pass low-pass filters 304a, 304b having the anti-aliasing function and are then amplified by base band amplifiers 305a, 305b. After this, the base band signals are detected by a detector section 306 which effects the process such as delay detection or synchronous detection, for example. If a digital system is applied to the detection system, analog/digital converters may be used at the succeeding stages of the base band amplifiers 305a, 305b.

Further, AC coupling sections 307a, 307b provided at the succeeding stage of the mixers 303a, 303b are used to eliminate the DC component in order to prevent the amplifiers 305a, 305b from being saturated by DC components generated in the mixers 303a, 303b. Recently, the above orthogonal modulating system is applied to various mobile communication devices in the demodulation of the orthogonal modulation signal such as a QPSK (quadrature phase shift keying) or QAM (quadrature amplitude modulation).

Figure 14:
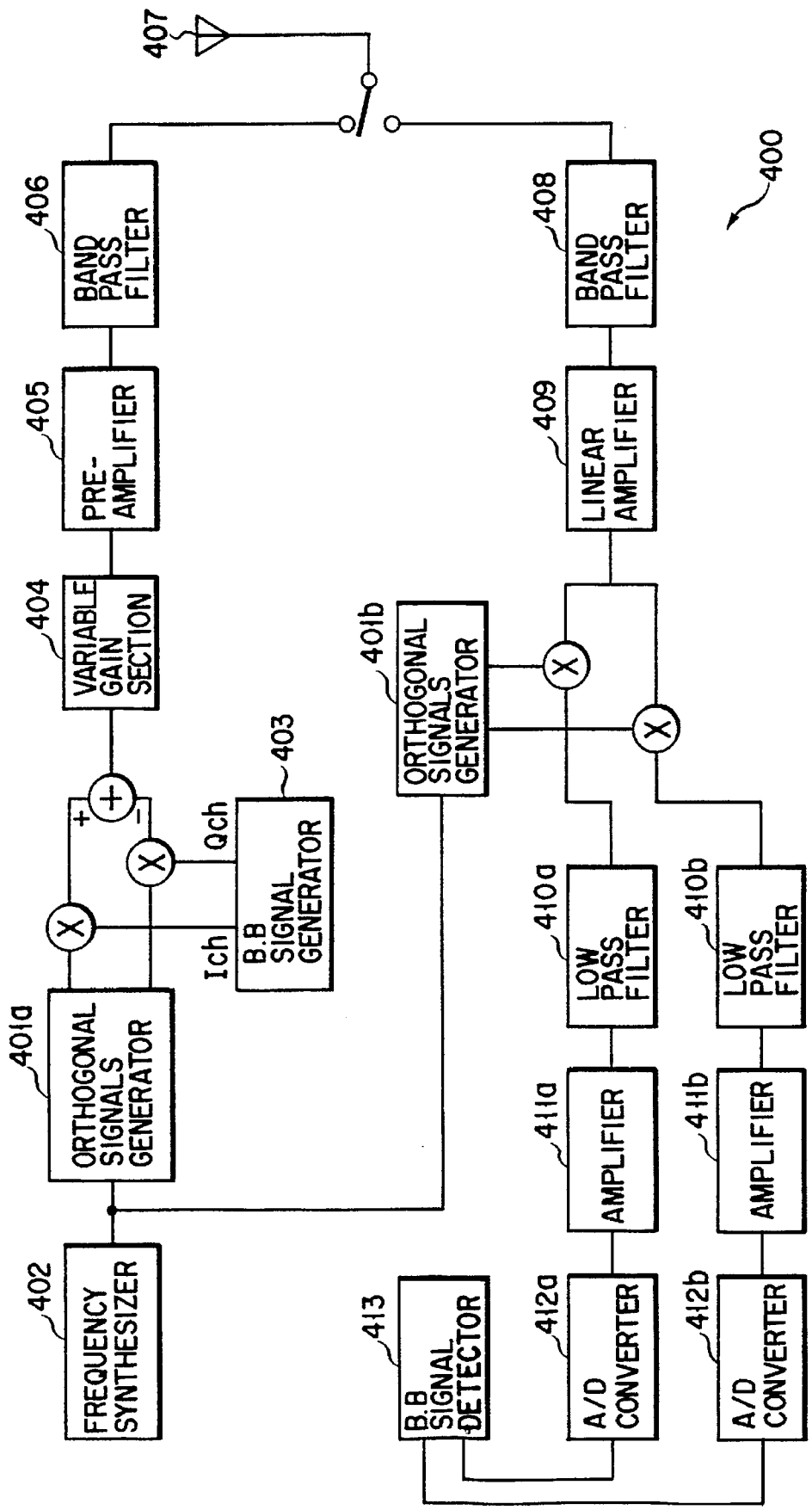
FIG. 14 is a block diagram showing the construction of a communication device to which a direct conversion system in which the orthogonal signal generation system of this invention is used is applied.

Next, a mobile communication device of direct conversion system to which this invention is applied is explained with reference to FIG. 14. FIG. 14 shows the construction of a communication device 400 having the construction for reception/transmission.

During transmitting period, an orthogonal signal generation circuit 401a to which the orthogonal signal generation system of this invention is applied (in which, for example, the construction shown in FIG. 4 is used) outputs signals whose phases are different from each other by 90° based on a local signal generated from a frequency synthesizer 402. The respective output signals are multiplied by signals Ich, Qch output from a base band signal generation circuit 403. After this, a difference between the multiplied signals is derived and a difference signal is supplied to a variable gain section 404. In the variable gain section 404, an input signal is amplified without causing distortion in the signal and the amplified signal is output to a succeeding-stage preamplifier 405. A signal output from the variable gain section 404 is output to the exterior from an antenna 407 via the preamplifier 405 and band-pass filter 406.

During receiving period, a signal received by the antenna 407 is subjected to the band-pass filtering process by a band-pass filter 408 to eliminate signal components of frequencies other than desired frequencies and the thus filtered signal is amplified by a linear amplifier 409. After this, the signal is divided into two channels and multiplied by signals whose phases are different from each other by 90° and which are generated from an orthogonal signal generation circuit 401b to which the orthogonal signal generation system is applied. The multiplied signals are respectively supplied to amplifiers 411a, 411b for amplification via low-pass filters 410a, 410b. Since the communication device shown in FIG. 13 utilizes a digital system, analog/digital converters 412a, 412b are provided at the succeeding stage of the amplifiers 411a, 411b. Output signals of the analog/digital converters 412a, 412b are supplied to a base band signal detector 413.

In the above communication device of direct conversion system, there occurs a problem that the local signal generated from the frequency synthesizer 402 leaks into the RF signal. In modulator, this local signal leaks acceptable for wireless system is specified. In demodulator, this local signal leaks may cause BER (Bit Error Ratio) to increase, and may affect other wireless equipment, because this local signal radiate from antenna via Linear amplifier and Band pass filter. Therefore, when the direct conversion system is used, it is necessary to suppress the power of the local signal. In the orthogonal signal generation system according to this invention, since the high gain can be attained as described before, the carrier of the same power as that of the conventional case can be output with the power of the local signal kept at the low level. Therefore, the problem mentioned above can be prevented by use of the orthogonal signal generation system.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An orthogonal signal generation system comprising:
   current control means including a variable current source, for controlling a current value according to an input signal;
   phase shifting means for outputting first and second signals whose phases are different from each other by 90° and each of the first signal and the second signal having an amplitude corresponding to the controlled current value; and
   a power supply for supplying a present voltage to said current control means and phase shifting means.

2. An orthogonal signal generation system according to claim 1, wherein said current control means includes a linear element connected between said power supply and said variable current source, and said phase shifting means includes an integrator and a differentiator which are connected in parallel with said linear element.

3. An orthogonal signal generation system according to claim 2, wherein said linear element includes an inductor, each of said integrator and differentiator includes a capacitor connected in parallel with said inductor, and a resonance frequency of the parallel circuit of said inductor and said capacitor of said integrator and differentiator is set equal to a frequency of the input signal.

4. An orthogonal signal generation system according to claim 2, wherein said linear element includes a resistor.

5. An orthogonal signal generation system according to claim 2, further comprising output means supplied with a preset voltage from said power supply and including first and second emitter followers each comprising a transistor and a current source, said first emitter follower outputting the first signal output from said phase shifting means to an external circuit and said second emitter follower outputting the second signal from said phase shifting means to the external circuit.

6. An orthogonal signal generation system according to claim 2, wherein said differentiator includes a series circuit of a first capacitor and a first resistor and said integrator includes a series circuit of a second capacitor and a second resistor.

7. A communication device of super heterodyne system comprising:
   demodulating means for demodulating signals, comprising,
      current control means including a variable current source and a liner element connect to said variable current source, for controlling a current value according to an input signal,
      phase shifting means, including an integrator and a differentiator which are connected in parallel with said liner element, for outputting first and second signals whose phases are different from each other by 90° and each of the first signal and the second signal having an amplitude corresponding to the controlled current value, and a power supply, connected to said liner element, for supplying a preset voltage to said current control means and phase shifting means.

8. A communication device of direct conversion system comprising:

frequency converting means for converting a base band signal of a transmission portion of said communications device into an RF (radio frequency) signal and for converting an RF signal of a reception portion of said communications device into a base band signal, comprising, current control means including a variable current source and a liner element connect to said variable current source, for controlling a current value according to an input signal, phase shifting means, including an integrator and a differentiator which are connected in parallel with said liner element, for outputting first and second signals whose phases are different from each other by 90° and each of the first signal and the second signal having an amplitude corresponding to the controlled current value, and a power supply, connected to said liner element, for supplying a preset voltage to said current control means and phase shifting means.

9. A demodulator comprising:

current control means including a variable current source and a liner element connect to said variable current source, for inputting an RF (radio frequency) signal as an input signal and for controlling a current value according to the input signal;

phase shifting means, including an integrator and a differentiator which are connected in parallel with said liner element, for outputting first and second signals whose phases are different from each other by 90° and each of the first signal and the second signal having an amplitude corresponding to the controlled current value;

a power supply, connected to said liner element, for supplying a preset voltage to said current control means and phase shifting means; and multiply means for inputting a local signal, for multiplying the input local signal and the first signal and for multiplying the input local signal and the second signal.

10. An orthogonal signal generation system comprising:

first current control means including a first variable current source, for controlling a first current value according to an input signal;

second current control means including a second variable current source, for controlling a second current value according to an inverted signal of the input signal;

first phase shifting means for outputting a first signal and a second signal which is shifted from the first signal by a phase of 90° and each of the first signal and the second signal having an amplitude corresponding to the controlled first current value;

second phase shifting means for outputting a third signal and a fourth signal which is shifted from the third signal by a phase of 90° and each of the third signal and the fourth signal having an amplitude corresponding to the controlled second current value;

output means for outputting a first differential signal between the first and third signals and a second differential signal between the second and fourth signals; and a power supply for supplying a preset voltage to said first and second current control means and said first and second phase shifting means.

11. An orthogonal signal generation system according to claim 10, wherein said first current control means includes a first linear element connected between said power supply and said first variable current source, said second current control means includes a second linear element connected between said power supply and said second variable current source, said first phase shifting means includes a first integrator and a first differentiator which are connected in parallel with said first linear element, and said second phase shifting means includes a second integrator and a second differentiator which are connected in parallel with said second linear element.

12. An orthogonal signal generation system according to claim 11, wherein each of said first and second linear elements includes an inductor, each of said first integrator and first differentiator has a capacitor connected in parallel with said inductor of said first linear element, each of said second integrator and second differentiator has a capacitor connected in parallel with said inductor of said second linear element, and a resonance frequency of a parallel circuit of said first linear element, first integrator and first differentiator and a resonance frequency of a parallel circuit of said second linear element, second integrator and second differentiator are set equal to a frequency of the input signal.

13. An orthogonal signal generation system according to claim 11, wherein each of said first and second linear elements includes a resistor.

14. An orthogonal signal generation system according to claim 10, wherein each of said first and second integrators and said first and second differentiators includes a capacitor and a resistor.

15. An orthogonal signal generation system according to claim 10, wherein output means includes means for deriving a difference between the first and third signals and means for deriving a difference between the second and fourth signals.

16. A communication device of super heterodyne system comprising:

demodulating means for demodulating signals, comprising, first current control means including a first variable current source and a first liner element connected to said variable current source, for controlling a first current value according to an input signal, second current control means including a second variable current source and a second liner element connected to said variable current source, for controlling a second current value according to an inverted signal of the input signal, first phase shifting means, including a first integrator and a first differentiator which are connected in parallel with said first liner element, for outputting a first signal and a second signal which is shifted from the first signal by a phase of 90° and each of the first signal and the second signal having an amplitude corresponding to the controlled first current value, second phase shifting means, including a second integrator and a second differentiator which are connected in parallel with said second liner element, for outputting a third signal and a fourth signal which is shifted from the third signal by a phase of 90° and each of the third signal and the fourth signal having an amplitude corresponding to the controlled second current value, output means for outputting a first differential signal between the first and third signals and a second differential signal between the second and fourth signals, and a power supply, connected to said first liner element and said second liner element, for supplying a preset voltage to said first and second current control means and said first and second phase shifting means.

17. A communication device of direct conversion system comprising:

frequency converting means for converting a base band signal of a transmission portion of said device into an RF signal and for converting an RF signal of a reception portion of said device into a base band signal, comprising, first current control means including a first variable current source and a first liner element connected to said variable current source, for controlling a first current value according to an input signal, second current control means including a second variable current source and a second liner element connected to said variable current source, for controlling a second current value according to an inverted signal of the input signal, first phase shifting means, including a first integrator and a first differentiator which are connected in parallel with said first liner element, for outputting a first signal and a second signal which is shifted from the first signal by a phase of 90° and each of the first signal and the second signal having an amplitude corresponding to the controlled first current value, second phase shifting means, including a second integrator and a second differentiator which are connected in parallel with said second liner element, for outputting a third signal and a fourth signal which is shifted from the third signal by a phase of 90° and each of the third signal and the fourth signal having an amplitude corresponding to the controlled second current value, output means for outputting a first differential signal between the first and third signals and a second differential signal between the second and fourth signals, and a power supply, connected to said first liner element and said second liner element, for supplying a preset voltage to said first and second current control means and said first and second phase shifting means.

18. A demodulator comprising:

first current control means including a first variable current source and a first liner element connected to said variable current source, for inputting an RF (radio frequency) signal as an input signal and controlling a first current value according to the input signal;

second current control means including a second variable current source and a second liner element connected to said variable current source, for controlling a second current value according to an inverted signal of the input signal;

first phase shifting means, including a first integrator and a first differentiator which are connected in parallel with said first liner element, for outputting a first signal and a second signal which is shifted from the first signal by a phase of 90° and each of the first signal and the second signal having an amplitude corresponding to the controlled first current value;

second phase shifting means, including a second integrator and a second differentiator which are connected in parallel with said second liner element, for outputting a third signal and a fourth signal which is shifted from the third signal by a phase of 90° and each of the third signal and the fourth signal having an amplitude corresponding to the controlled second current value;

output means for outputting a first differential signal between the first and third signals and a second differential signal between the second and fourth signals;

a power supply, connected to said first liner element and said second liner element, for supplying a preset voltage to said first and second current control means and said first and second phase shifting means; and multiply means, for multiplying the input local signal and the first differential signal and for multiplying the input local signal and the second differential signal.

* * * * *